United States Patent [19]

Hunt

[11] Patent Number: 4,467,422
[45] Date of Patent: Aug. 21, 1984

[54] ARRAY PROCESSOR

[75] Inventor: David J. Hunt, Stotfold, England

[73] Assignee: International Computers Limited, London, England

[21] Appl. No.: 508,175

[22] Filed: Jun. 27, 1983

Related U.S. Application Data

[63] Continuation of Ser. No. 240,896, Mar. 15, 1981, abandoned.

[30] Foreign Application Priority Data

Mar. 28, 1980 [GB] United Kingdom ............... 8010574

[51] Int. Cl.³ .......................... G06F 15/16; G06F 7/48
[52] U.S. Cl. .................................................. 364/200
[58] Field of Search ... 364/200 MS File, 900 MS File

[56] References Cited

U.S. PATENT DOCUMENTS

| | | | |
|---|---|---|---|
| 4,241,413 | 12/1980 | Hunt | 364/784 |
| 4,247,892 | 1/1981 | Lawrence | 364/200 |
| 4,251,861 | 2/1981 | Mago | 364/200 |
| 4,270,170 | 5/1981 | Reddaway | 364/200 |
| 4,304,002 | 12/1981 | Hunt | 371/49 |
| 4,314,349 | 2/1982 | Batcher | 364/716 |

FOREIGN PATENT DOCUMENTS 1445714 8/1976 United Kingdom.
1536933 12/1978 United Kingdom.

Primary Examiner—Thomas M. Heckler
Attorney, Agent, or Firm—Lee, Smith & Zickert

[57] ABSTRACT

An array processor in which each sub-array of processing elements has a group of check-bit processing elements associated with it. The check-code processing elements have north-south interconnections, but have no east-west connections. Instead, the northernmost element of each group is connected diagonally to the southernmost element of the neighboring group, so as to permit serial transfer of check codes, over the north-south connections and the diagonal connections, between adjacent groups in the east-west direction.

5 Claims, 10 Drawing Figures

PARITY PROCESSING ELEMENT

ARRAY PROCESSOR

This is a continuation of application Ser. No. 240,896, filed Mar. 15, 1981, abandoned.

BACKGROUND TO THE INVENTION

This invention relates to data processing systems of the kind comprising a plurality of processing elements logically arranged in rows and columns so that each element has four nearest neighboring elements. Such a system is described for example in British Patent Specification Nos. 1445714, 1536933, U.S. Pat. Nos. 4,270,170, 4,241,413, and 4,304,002.

In such a system, it is usually desired to allow each element to send information to, and receive information from, any of its four nearest neighbors. In the specifications referred to above, this is achieved by connecting each element to its four neighbors by means of a separate connection path. One object of the present invention is to reduce the number of connection paths required to transfer information between neighboring elements.

SUMMARY OF THE INVENTION

According to the invention there is provided a data processing system comprising a plurality of processing elements logically arranged in rows and columns, characterised in that each column is divided into a plurality of groups of elements, the elements within each group being connected together to permit information to be transferred northwards and southwards between adjacent elements within the same group, and characterized by a plurality of switching circuits each having two states, wherein
  (a) in the first state the switching circuits connect the northernmost element of each group to the southernmost element of the adjacent group in the northern direction, thereby permitting information to be transferred northwards and southwards between adjacent groups in the same column, and
  (b) in the second state the switching circuits connect the northernmost element of each group to the southernmost element of the adjacent group in the western direction, thereby permitting information to be transferred eastwards and westwards between adjacent groups in different columns.

It can be seen that the invention replaces a plurality of east-west connections between members of an adjacent pair of groups by a single "diagonal" connection between the northernmost element of one group and the southernmost element of the group to the west of it. Shifting of information eastwards or westwards is achieved by placing the switching circuits in their second states, and then performing a sequence of northward or southward shifts over the diagonal connections. It can be seen that the invention significantly reduces the number of connection paths.

In a particular embodiment of the invention to be described, the system comprises a plurality of data processing elements and a plurality of check code processing elements, each check code processing element holding a check code (e.g. parity bits) in respect of a predetermined plurality of data processing elements. In the described embodiment, the invention is used to reduce the number of connections between the check code processing elements. However, the data processing elements are connected in the conventional manner i.e. each having a separate connection path to each of its four neighbors.

It should be appreciated that the phrase "logically arraanged" is intended to imply that the arrangement of the elements in rows and columns is not necessarily an actual physical arrangement. In practice, the elements could be mounted on printed circuit boards in any convenient physical configuration, with suitable electrical connections to form the required logical arrangement. Similarly, it should be appreciated that the terms "north", "east", "south" and "west" are used in this specification merely to describe the logical relationships between the elements and should not be taken to imply any particular physical arrangement.

BRIEF DESCRIPTION OF THE DRAWINGS

One data processing system in accordance with the invention will now be described by way of example with reference to the accompanying drawings of which.

DESCRIPTION OF THE PREFERRED EMBODIMENT OF THE INVENTION

Figure 1:
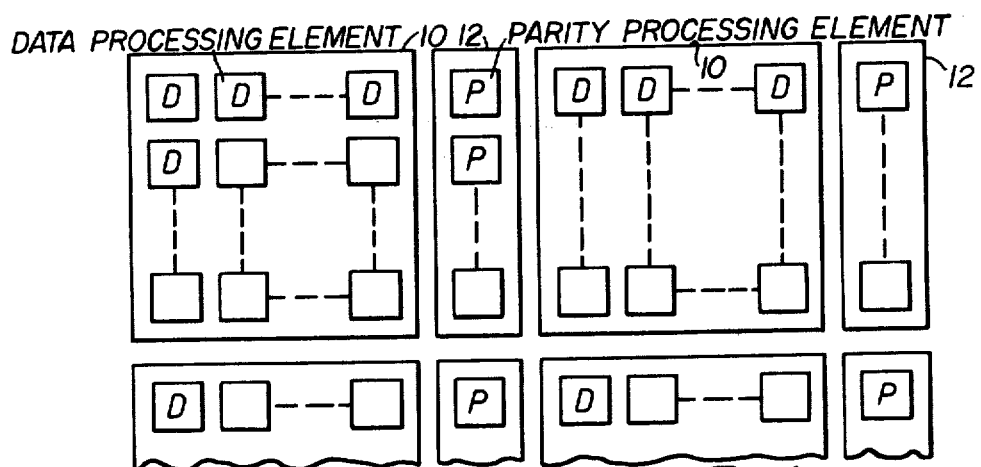
FIG. 1 is an overall block diagram of the system.

FIG. 1 shows a data processing system comprising 4096 identical data processing elements D arranged in 64 rows and 64 columns. Each element may be of the form shown in the published patent specifications referred to above, and will therefore not be described in detail herein. Briefly, however, each element D contains a data store having a large number of individually addressable bit locations, various single-bit internal registers, a single-bit binary adder, and various gates for controlling the movement of data between the store, registers and adder. The elements D are controlled by signals which are broadcast to all the elements in parallel, so that all the elements perform basically the same operations, but on different data.

The array of elements D is shown as being subdivided into sixty-four square sub-arrays 10, each containing $8 \times 8$ elements. Each sub-array has a group 12 of eight parity processing elements P associated with it, one for each row. As described in U.S. Pat. No. 4,304,002, the parity processing elements P are substantially identical with the data processing elements D, and are controlled by the same control signals, so that each parity processing element performs basically the same manipulations on the parity bits as the data processing elements perform on the data. For example, if a data bit is transferred from the store of each data processing element to one of its internal registers, the corresponding parity bit is transferred from the store of each parity processing element to the corresponding internal register in that element.

Figure 2:
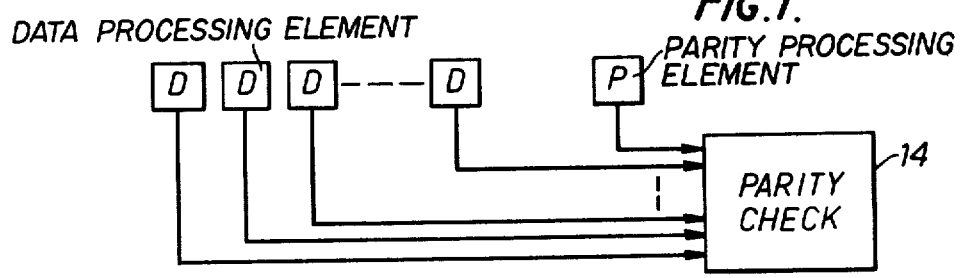
FIG. 2 shows the connections between the data processing elements, parity processing elements, and parity checking circuits.

FIG. 2 shows one of the rows of data processing elements in a sub-array, and the corresponding parity processing element. Output data bits from the eight data processing elements are fed to a parity checking circuit 14, where they are checked against the corresponding parity bit from the parity processing element. If there is an error, the checking circuit 14 generates an error signal. Parity checking is well known, and so it is not necessary to describe the circuit 14 in detail.

Figure 3:
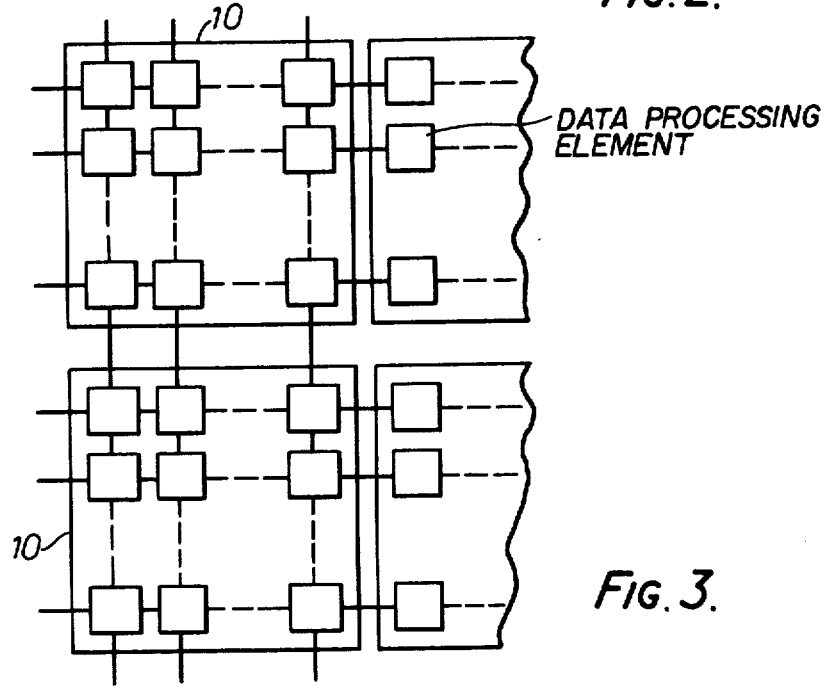
FIG. 3 shows the interconnections between the data processing elements.

FIG. 3 shows the way in which the data processing elements are connected together to permit transfer of data between them. Each data processing element D is connected to its four nearest neighbors in the north, east, south and west directions. The exception to this is at the boundaries of the array where, of course, the elements have fewer than four neighbors. However, the elements along the north edge of the array may be connected to those on the south edge so that each column consists effectively of a loop of elements. Similarly, the rows may be connected as loops.

The direction of transfer of data between the elements is governed by a routing code which is broadcast from a controller to all the elements in parallel. The routing code consists of two bits, the significance of which is as follows:

| Routing code | Direction |
|---|---|
| 00 | North |
| 01 | East |
| 10 | South |
| 11 | West |

Figure 4:
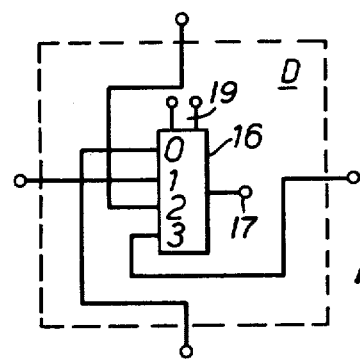
FIG. 4 shows a circuit in one of the data processing elements for selecting data inputs from neighboring elements.

Referring to FIG. 4, each data processing element contains a multiplexer 16 having four inputs 0, 1, 2, 3 connected to receive data from the four neighboring elements in the south, west, north and east directions respectively and an output 17. The multiplexer 16 is controlled by the routing code on lines 19, so that it selects one of its four inputs in accordance with the binary value of the code. For example, if the routing code is 00, input 0 is selected, so that each element accepts data from its southern neighbor. As a result, data flows northwards.

Figure 5:
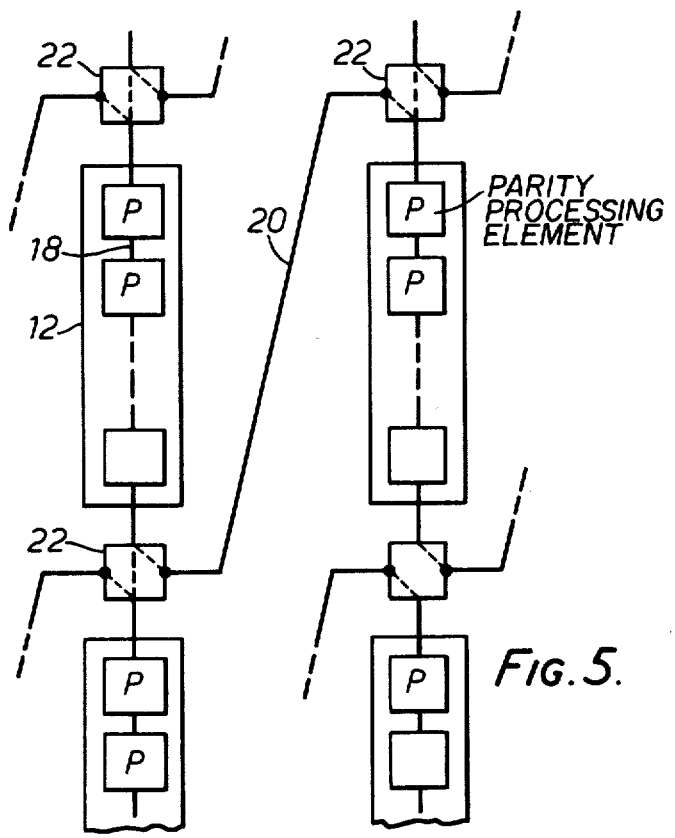
FIG. 5 shows the interconnections between the parity processing elements.

FIG. 5 shows the way in which the parity processing elements P are interconnected. Within each group 12 they are interconnected by north-south connections 18. However, there are no east-west connections. Instead, transfer of parity bits between adjacent groups of parity processing elements in the east-west direction is achieved by diagonal paths 20 which connect the northernmost element in each group with the southernmost element in the adjacent group to the west. Switching circuits 22 are provided to determine whether the parity bits are to be shifted between adjacent groups in the north-south direction or over the diagonal paths 20.

Figure 6:
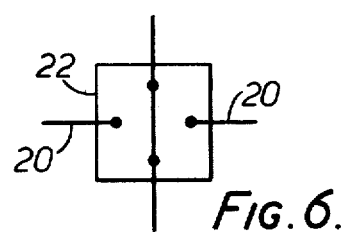
FIGS. 6 and 7 show two possible states of a switching circuit.
Figure 7:
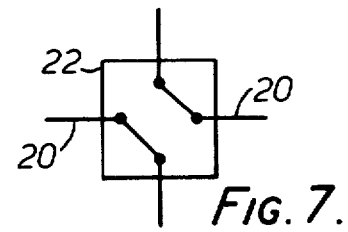

Each switching circuit 22 has two states and is controlled by the second bit of the routing code. When the routing code denotes north or south (i.e. the second bit=0) the switching circuit makes the connection shown in FIG. 6 i.e. it connects the northernmost element in each group to the southernmost element in the adjacent group to the north. When the routing code denotes east or west (i.e. the second bit=1) the switching circuit makes the connection shown in FIG. 7 i.e. it connects the northernmost and southernmost elements to the respective diagonal paths 20.

Although the switching circuits 22 are represented symbolically in the drawings as mechanical switches, in practice they are electronic switches constructed in a conventional manner from known logic components.

Figure 8:
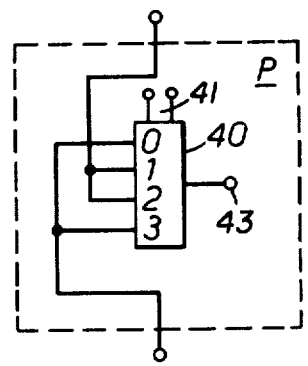
FIG. 8 shows a circuit in one of the parity processing elements for selecting parity bit inputs from neighboring elements.

Referring to FIG. 8, each parity processing element P contains a multiplexer 40 having four inputs 0,1,2,3 and controlled by the routing code on lines 41 in a similar manner to the multiplexer 16 in FIG. 4. However, in this case, there is no connection from eastern and western neighbors. Instead, the input from the southern neighbor is connected to inputs 0 and 3, and the input from the northern neighbor is connected to inputs 1 and 2.

Thus, when the routing code denotes west (11), the parity bits are shifted nothwards within the groups of elements and are shifted over the diagonal paths 20 (because of the switching circuit connections shown in FIG. 7) between groups. It can be seen that after eight such shifts have been performed the contents of each group of parity processing elements willhave been shifted westwards into the adjacent group of parity processing elements, corresponding to the westward shift of data from one of the sub-arrays 10 (FIG. 1) into the adjacent sub-array.

Similarly, when the routing code denotes east (01) the parity bits are shifted southwards within the groups and over the diagonal paths 20 between groups, so that after eight such shifts the contents of each group of parity processing elements will have been shifted eastwards into the adjacent group of parity processing elements.

In summary, it can be seen that whenever data is shifted by a multiple of eight steps between the data processing elements D, the corresponding parity bits are shifted between the parity processing elements so as to maintain them in the correct relationship to the data.

The data processing elements and parity processing elements are preferably implemented in the form of LSI (large-scale integrated circuit) chips. Conveniently, four processing elements may be incorporated in each LSI chip, providing a 2×2 portion of the array. However, it can be seen from FIG. 5 that the parity processing elements must be connected in a linear manner rather than in a 2-dimensional array.

Figure 9:
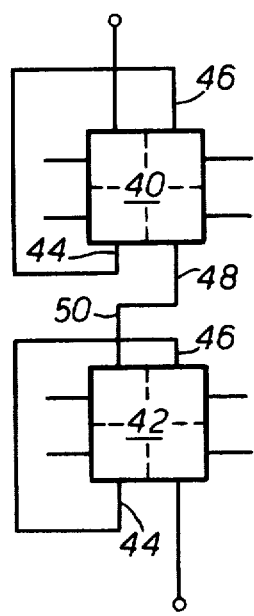
FIGS. 9 and 10 illustrate possible ways of connecting parity processing elements consisting of LSI (large scale integrated circuit) chips.

The way in which this problem is solved is shown in FIG. 9. This shows two LSI chips 40 and 42, each containing a 2×2 configuration of parity processing elements. The south-western element on each chip has its southern connection 44 wired to the northern connection 46 of the north-eastern element on the same chip. Also, the southern connection 48 from the south-eastern element on the upper chip 40 is wired to the northern connection 50 from the north-western element on the lower chip 42. The effect is to join the eight elements in series, by way of their north-south connections, thus forming one of the groups 12 of parity processing elements shown in FIG. 5.

Figure 10:
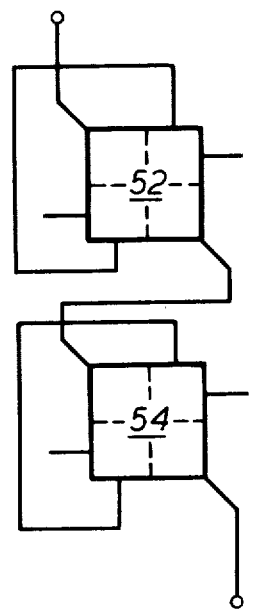

In the above-mentioned U.S. Pat. No. 4,270,170 there is described a way of reducing the number of terminals on an LSI chip by combining adjacent pairs of terminals. The present invention could equally well be implemented using chips of the form described in that specification. FIG. 10 shows the way in which two of these chips 52 and 54 would be connected to achieve the same effect as in FIG. 9.

In the arrangement described above, there are different data connections to the routing multiplexers in the data processing elements and the parity processing elements, as shown in FIGS. 4 and 8. However, in an LSI implementation, it would probably be more convenient to make these connections identical (i.e. to make them all as shown in FIG. 4) and instead to vary the address inputs to the routing multiplexers, so that the parity processing elements would receive only "north" and "south" routing codes.

In another variation of the system described above, the array could be divided into rectangular sub-arrays instead of square sub-arrays. In such an arrangement, it is clear that the number of steps needed to shift the parity bits in the east-west direction between adjacent groups, over the diagonal paths, would be different from the number of steps needed to shift the data bits between adjacent sub-arrays. It would therefore be necessary to introduce additional control circuits to inhibit some of the clock pulses to (or generate some extra clock pulses for) the parity processing elements during the east-west shifts to ensure that the parity bits were kept in the correct relationship to the data.

I claim:
1. A data processing system comprising
   (i) a plurality of processing elements logically arranged in rows and columns, each column being divided into a plurality of groups of n elements (where n is an integer greater than one),
   (ii) a plurality of data paths connecting together serially the elements within each group, and
   (iii) switching means connected to the northernmost element in each group, the switching means being operable in a first state to connect said northernmost element to the southernmost element of the adjacent group in the same column in the northern direction thereby permitting data to be transferred northwards and southwards between processing elements in the same column, and the switching means being operable in a second state to connect said northernmost element to the southernmost element of a group in an adjacent column thereby permitting data to be transferred eastwards and westwards between different columns.

2. A system according to claim 1 wherein said processing elements are check code processing elements, and wherein the system further includes a plurality of data processing elements, each check code processing element holding a check code in respect of data held in a predetermined plurality of the data processing elements.

3. A system according to claim 2 wherein said data processing elements are logically arranged in rows and columns, and each data processing element is connected to its four nearest neighbor data processing elements in the north, east, south and west directions.

4. A system according to claim 3 further including
   (i) means for communicating a routing code to all the check code processing elements and data processing elements such that each element receives the same code value, the code value representing one of the directions north, east, south and west,
   (ii) selection means in each data processing element, responsive to said routing code, for selecting data from the southern, western, northern or eastern neighboring data processing element according to whether the code value represents north, east, south or west, and
   (iii) selection means in each check code processing element, responsive to said routing code, for selecting data from the southern neighboring check code processing element if the code value represents noth or west, and selecting data from the northern neighboring check code processing element if the code value represents south or east.

5. A data processing system comprising
   (i) a plurality of processing elements logically arranged in rows and columns,
   (ii) first connection means for connecting each processing element to adjacent processing elements in the same column, thereby permitting data to be transferred between processing elements along the columns, and
   (iii) second connection means for connecting only every nth processing element in each column (where n is an integer greater than one) to a processing element in an adjacent column, thereby permitting data to be transferred between adjacent columns.

* * * * *